(12) United States Patent
Ma et al.

(10) Patent No.: US 6,830,877 B2
(45) Date of Patent: Dec. 14, 2004

(54) METHOD FOR FORMING VIA AND CONTACT HOLES WITH DEEP UV PHOTORESIST

(75) Inventors: Ching-Tien Ma, Tainan (TW); Tsung-Chuan Chen, Tainan (TW); Shew-Tsu Hsu, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 69 days.

(21) Appl. No.: 10/038,800

(22) Filed: Dec. 31, 2001

(65) Prior Publication Data

US 2003/0124464 A1 Jul. 3, 2003

(51) Int. Cl.⁷ .................................. G03F 7/00
(52) U.S. Cl. ................ 430/327; 430/311; 430/313; 430/314; 430/317; 430/328; 430/330; 438/694
(58) Field of Search ................. 430/311, 313, 430/314, 317, 327, 328, 330; 438/694

(56) References Cited

U.S. PATENT DOCUMENTS

| | | | | |
|---|---|---|---|---|
| 4,444,456 A | * | 4/1984 | Jain et al. | 359/16 |
| 5,783,459 A | * | 7/1998 | Suzuki et al. | 438/612 |
| 6,162,724 A | * | 12/2000 | Hsia et al. | 438/669 |
| 2001/0045646 A1 | * | 11/2001 | Shields et al. | 257/734 |

* cited by examiner

Primary Examiner—Mark F. Huff
Assistant Examiner—Nicole Barreca
(74) Attorney, Agent, or Firm—Tung & Associates

(57) ABSTRACT

A method for forming via openings or contact holes with improved aspect ratios by using a deep UV photoresist is described. In the method, after a deep UV photoresist layer is deposited on top of a thick oxide layer, the deep UV photoresist layer is pre-treated by a curing process with UV radiation for a time period of at least 1 min, and preferably between about 1 min and about 10 min at a temperature of at least 100° C., and preferably at least 160° C. The curing process stabilizes the structure of the deep UV photoresist material and thus reduces the formation of fluorocarbon polymers by the carbon component in the photoresist material and the fluorine component in the etchant gas, and subsequently, reduces the coating of such fluorocarbon polymers at the bottom of the via openings which would otherwise stop the etching process during via or contact formation.

14 Claims, 1 Drawing Sheet

METHOD FOR FORMING VIA AND CONTACT HOLES WITH DEEP UV PHOTORESIST

FIELD OF THE INVENTION

The present invention generally relates to a method for forming via and contact holes in an insulating material layer situated on a semiconductor substrate and more particularly, relates to a method for forming via and contact holes in an insulating material layer on top of a semiconductor substrate with improved aspect ratios by using deep UV photoresist.

BACKGROUND OF THE INVENTION

In the manufacture of semiconductor devices, metal vias and contacts are formed in via openings and contact holes on semiconducting wafers that have been preprocessed. Semiconductor devices are thus fabricated by connecting the components with metal vias and contacts to form an integrated circuit. In particular, aluminum, aluminum alloys, tungsten and tungsten alloys are frequently used for depositing into via openings and contact holes on semiconducting substrate. The deposition processes can be carried out by a physical vapor deposition (or sputtering) technique or by a chemical vapor deposition technique.

As the dimensions of semiconductor devices are continuously being reduced in a miniaturization effort for matching devices on the sub-half-micron level, via openings and contact holes must also be made smaller. Consequently, the openings and holes to be filled have larger aspect ratios, i.e., the ratios between the depth of the opening or hole and the diameter.

Difficulties have been encountered in depositing a conductive metal into via openings and contact holes that have large aspect ratios by a conventional sputtering process. As the openings or holes become smaller and deeper, the bottom and sides of an opening or hole receive fewer deposited metal particles than the top surface of the device. The end result of such a phenomenon, sometimes called a shadowing effect, is that metal layers formed by the particles hang over the opening forming an overhang. The overhang closes before the opening is completely filled as the deposition process progresses and thus creating a void in the opening or hole.

One technique used to compensate for the shadowing effect of the sputtering process is to taper the sidewalls of the via openings or the contact holes. For instance, during the formation, by a dry etching or reactive ion etching process, the top of the opening is etched more than the bottom of the opening. The sidewalls of the opening therefore may have an angle as high as of 15° with the vertical axis parallel with the depth of the opening. The tapered via opening or contact hole eliminates significantly the under-fill or shadowing effect of the sputtering process, for instance, by aluminum particles. However, the tapered via or contact formed (after filled by aluminum and then etched back) has the drawback of popping out of the via opening or contact hole in a defect known as via delamination. The via delamination becomes a serious problem in a semiconductor device since the device after formation of the via or contact, may be subjected to various thermal cycling processes such as those encountered in various etching, passivation or planarization processes. The expansion or contraction of the metal via or contact caused by the thermal stress during cycling can easily delaminate the via or contact from its opening. When the via delamination defect occurs, the circuit in the semiconductor device fails and the yield of the wafer can be severely affected.

Another difficulty is encountered in forming via holes or contact openings at larger aspect ratios when deep UV photoresist is utilized in the photolithography process. Deep UV photoresist materials have been used in modern IC devices that have feature sizes below 0.4 $\mu$m. The deep UV photoresist material can normally be imaged in the 100~300 nm range, for instance, by using a krypton-fluoride (KrF) laser source at 248 nm wavelength, or an argon fluoride (ArF) laser source at 193 nm, or a fluorine ($F_2$) at 157 nm. These laser emissions are of the excimer type which go through transitions from a meta-stable state to an unstable ground state. Photoresist materials have also been developed for exposure at such shorter wavelengths to achieve higher resolution. For instance, such deep UV photoresist includes PMMA, which is sensitive for wavelength at smaller than 250 nm and polybutane sulfone which is sensitive for wavelengths smaller than 200 nm. There are also chemically amplified photoresists which exhibit high photo-speed, excellent resolution and process tolerance. A deep UV photoresist material frequently contains a photo-acid-generator such that hydrogen ions are emitted when the photoresist layer is subjected to UV radiation and heating which accelerates the hydrogen ion generation process. The hydrogen ions generated then combine with the fluorine contained in the oxide forming HF for etching away the oxide layers.

FIG. 1 shows a conventional process for forming a via opening or a contact hole on a semiconductor substrate by using a deep UV photoresist layer. The semiconductor structure 10 is built on a pre-processed semi-conducting substrate 12 with a conducting layer 14 deposited on top. The conducting layer 14 may either be a conductive gate formed of $CoSi_x$ or $TiSi_x$, etc. as a gate structure, or a conductive line such as one formed by Cu. An etch stop layer 16 which is generally formed of SiN, SiON or SiC is deposited on top of the conductive layer 14 as an etch-stop layer. After a thick oxide layer 18 such as an inter-level-dielectric (ILD) layer or an inter-metal-dielectric (IMD) layer and a deep UV photoresist layer 20 are sequentially deposited on top, the deep UV photoresist layer 20 is patterned, the oxide layer 18 is etched by a reactive ion etching (RIE) method to form the via opening or contact opening 30.

During the RIE process, fluorine contained in the etchant and the carbon contained in the deep UV photoresist material react to form a fluorocarbon-type polymer 22 that will deposit at the bottom of the via opening 30 and thus stopping the via opening formation process. The problem is especially severe when larger aspect ratio holes, i.e., having an aspect ratio of larger than 8, is formed in modern IC devices that uses 0.18 $\mu$m technology. For instance, in the fabrication of a dual damascene device.

In the dual damascene via etch process, an etch stop layer formed of SiN, SiON or SiC is normally used. The etch recipe is divided in two steps of a main etch which stops on the liner or etch stop layer and a liner removal etch for etching through the liner in order to obtain good resistance and leakage performance. The main etch recipe most of the time uses a heavy polymer gas to realize oxide/liner etch selectivity and to stop the etching process on the liner. However, as the via openings and contact holes are getting smaller in the next generation product, i.e., in 0.18 $\mu$m devices, the heavy polymer gas forms a fluorocarbon polymer with the deep UV resist material to coat the bottom of the via openings or the contact holes. The fluorocarbonbased polymeric material coating slows down the hole etching process effectively to produce a hole of smaller aspect ratio. For instance, FIG. 2 shows a conventional etching process utilizing a deep UV photoresist layer 20 in forming via openings 30 that have a length "$L_1$" of about 455 nm. This is about 200 nm smaller than that desired of an ideal via opening.

It is therefore an object of the present invention to provide a method for forming via openings or contact holes that does not have the drawbacks or shortcomings of the conventional method.

It is another object of the present invention to provide a method for forming via openings or contact holes that have improved aspect ratios.

It is a further object of the present invention to provide a method for forming via openings or contact holes by using a deep UV photoresist material that does not produce polymeric coating on the bottom of the via opening or contact hole.

It is another further object of the present invention to provide a method for forming via openings or contact holes by using a deep UV photoresist wherein the aspect ratios of the via openings or contact holes formed are larger than 8.

It is still another object of the present invention to provide a method for forming via openings and contact holes with a deep UV photoresist by first curing the photoresist material with UV radiation.

It is yet another object of the present invention to provide a method for forming via openings or contact holes that have improved aspect ratios by first exposing the photoresist to UV radiation for a time period of at least 1 minute at a temperature of at least 100° C.

SUMMARY OF THE INVENTION

In accordance with the present invention, a method for forming via openings or contact holes with improved aspect ratios by using a deep UV photoresist layer is disclosed.

In a preferred embodiment, a method for forming via openings or contact holes with improved aspect ratios by using deep UV photoresist can be carried out by the operating steps of providing a pre-processed semiconductor substrate; depositing a Si-containing etch stop layer on top of the substrate; depositing an oxide layer on the etch stop layer; depositing a deep UV photoresist on top of the oxide layer; curing the deep UV photoresist layer with UV radiation for at least 1 min; defining openings for the via or contact; and etching the openings forming the via or contact holes.

The method for forming via openings or contact holes with improved aspect ratios by using deep UV photoresist may further include the step of etching the openings to form via or contact holes that have an aspect ratio of at least 8. The method may further include the step of depositing the Si-containing etch stop layer with a material selected from the group consisting of $Si_3N_4$, SiON and SiC. The oxide layer deposited in the method may be an inter-level-dielectric (ILD) layer, or an inter-metal dielectric (IMD) layer. The method may further include the step of curing the deep UV photoresist with UV radiation for a time period between about 1 min and about 10 min. The method may further include the step of curing the deep UV photoresist with UV radiation at a temperature of at least 100° C. The method may further include the step of reducing fluorocarbon polymer formation from the deep UV photoresist material by curing with UV radiation. The method may further include the step of removing the Si-containing etch stop layer.

The present invention is further directed to a method for forming a large aspect ratio hole in an insulating material layer on a semi-conducting substrate that can be carried out by the steps of providing a pre-processed semi-conducting substrate that has an etch stop layer deposited on top; depositing an insulating material layer on the etch-stop layer; forming a deep UV photoresist layer on top of the insulating material layer; irradiating the deep UV photoresist layer with UV radiation for at least 1 min; etching a hole that has an aspect ratio of larger than 8 in the insulating material layer by using the deep UV photoresist layer; and removing the etch stop layer in the etched hole.

The method for forming a large aspect ratio hole in an insulating material layer on a semi-conducting substrate may further include the step of forming the hole with an aspect ratio between about 8 and about 20. The method may further include the step of depositing the insulating material layer with an inter-level-dielectric material. The method may further include the step of depositing the insulating material layer in silicon oxide. The method may further include the step of depositing the etch-stop layer by a material selected from the group consisting of $Si_3N_4$, SiON and SiC. The method may further include the step of irradiating the deep UV photoresist layer with UV radiation for a time period between about 1 min and about 10 min. The method may further include the step of etching the hole for a via or a contact.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming via openings and contact holes in an insulating material layer on a semiconductor substrate by utilizing a deep UV photoresist.

In the method, via openings or contact holes with improved aspect ratios can be formed by first depositing a silicon-containing etch stop layer on top of a pre-processed semiconductor substrate; an oxide layer, such as an ILD or an IMD layer, is then deposited on the etch stop layer; a deep UV photoresist layer is then formed on top of the oxide layer followed by a curing step with UV radiation for the photoresist layer for at least 1 minute. Via openings or contact holes are then defined in the deep UV photoresist followed by an etching step for forming the openings and holes with improved aspect ratios of at least 8.

The present invention method is effective in forming via openings or contact holes, when using a deep UV photoresist to achieve high resolution in 0.18 µm devices or beyond, that have improved aspect ratios of at least 8 or in the range between about 8 and about 20. The word "about" used in this writing indicates a range of values that is ±10% of the average value given. The method incorporates a unique pre-treatment step for the deep UV photoresist layer prior to the patterning process of the layer. The pre-treatment process encompasses a curing process by UV radiation for a time period of at least 1 min, and preferably between about 1 min and about 10 min at a suitable temperature, such as a temperature higher than 100° C., and more preferably higher than 160° C.

By utilizing the present invention novel method, the etching process for a deep via opening or contact hole will not be stopped by the formation and coating of fluorocarbon polymers at the bottom of the opening or hole. The UV curing step for the deep UV photoresist material effectively reduces the reaction of flourine from the etchant gas with carbon from the photoresist material and thus, the generation of fluorocarbon polymers by such reaction can be drastically reduced. Without the fluorocarbon polymer coating at the bottom of the via opening or contact hole, the etching process for the via opening or contact hole proceeds rapidly to achieve a higher aspect ratio.

Figure 3:
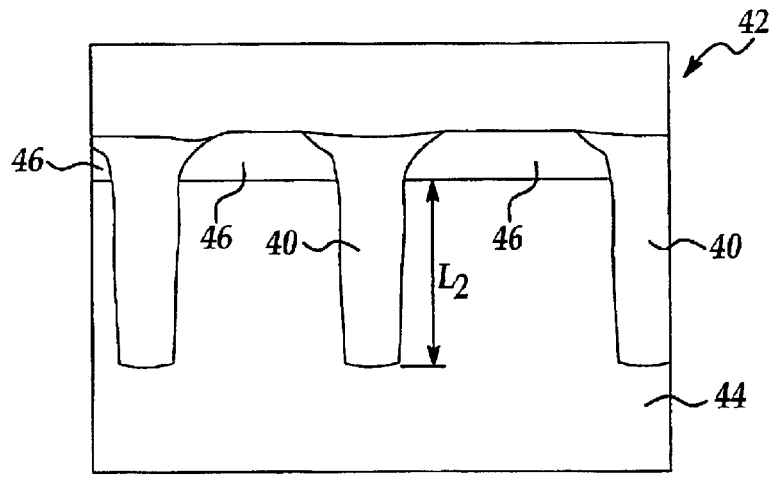
FIG. 3 is a graph illustrating a SEM micrograph obtained on a plurality of via openings formed by the present invention method incorporating a UV curing step for the deep UV photoresist layer prior to the hole formation process.

Referring now to FIG. 3 wherein a graph illustrating a SEM micrograph of a plurality of via openings 40 in a present invention semiconductor device 42 is shown. The semi-conducting substrate (not shown) is first deposited with an etch stop layer, and then a thick oxide layer 44 on top of the etch stop layer. On top of the thick oxide layer 44, is then formed a deep UV photoresist layer 46. The deep UV photoresist layer 46 is then cured by UV radiation at a temperature of at least 100° C., and preferably 160° C. for a time period between about 1 min and about 10 min, and preferably between about 2 min and about 4 min. The deep UV photoresist layer 46 is thus stabilized by the curing process and the reaction of carbon from the resist material in forming fluorocarbon polymers with fluorine from the etchant gas is thus greatly reduced.

Figure 1:
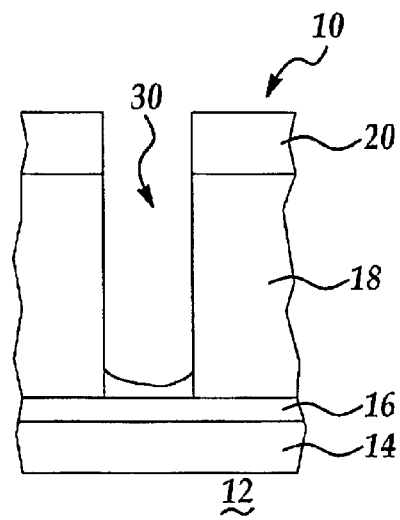
FIG. 1 is an enlarged cross-sectional view of a via opening formed by a conventional etching process utilizing a deep UV photoresist layer illustrating the formation of fluorocarbon polymer at the bottom of the via opening.
Figure 2:
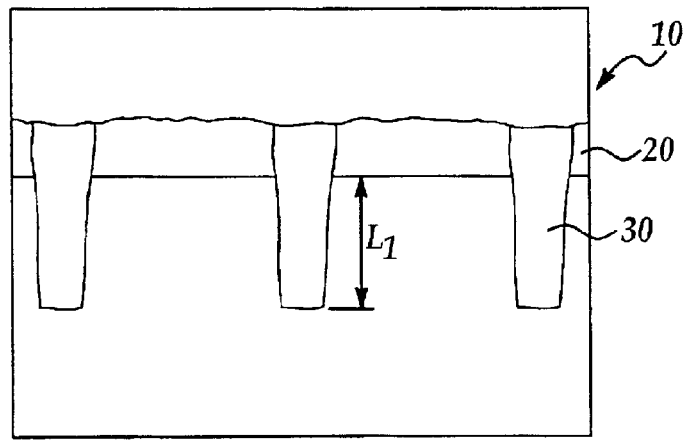
FIG. 2 is a graph illustrating a SEM micrograph obtained on a multiplicity of via openings formed by the conventional etching method utilizing deep UV photoresist.

As shown in FIG. 3, the depth of the via openings 40, shown as "$L_2$" is measured to be 639 nm, which represents a 40% improvement over that obtained by the conventional method shown in FIG. 2. As a result, a greatly improved aspect ratio is achieved The present invention novel method for forming via openings or contact holes with improved aspect ratios by using deep UV photoresist layers and pre-curing the layers prior to patterning has therefore been amply described in the above descriptions and in the appended drawing of FIG. 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming via or contact holes with improved aspect ratios by using deep UV photoresist comprising the steps of:

providing a pre-processed semiconductor substrate;

depositing a Si-containing etch stop layer on top of said substrate;

depositing an oxide layer on said etch stop layer;

depositing a deep UV photoresist on top of said oxide layer;

curing said deep UV photoresist with UV radiation for at least 1 minute;

defining openings for said via or contact; and etching said openings forming said via or contact holes having an aspect ratio of at least 8.

2. A method for forming via or contact holes with improved aspect ratios by using deep UV photoresist according to claim 1 further comprising the step of depositing said Si-containing etch stop layer with a material selected from the group consisting of $Si_3N_4$, SiON and SiC.

3. A method for forming via or contact holes with improved aspect ratios by using deep UV photoresist according to claim 1, wherein said oxide layer deposited is an inter-level-dielectric (ILD) layer.

4. A method for forming via or contact holes with improved aspect ratios by using deep UV photoresist according to claim 1 further comprising the step of curing said deep UV photoresist with UV radiation for a time period between about 1 minute and about 10 minutes.

5. A method for forming via or contact holes with improved aspect ratios by using deep UV photoresist according to claim 1 further comprising the step of curing said deep UV photoresist with UV radiation for a time period between about 1 minute and about 10 minutes at a temperature of at least 100° C.

6. A method for forming via or contact holes with improved aspect ratios by using deep UV photoresist according to claim 1 further comprising the step of reducing fluorocarbon polymer formation from said deep UV photoresist by curing with UV radiation.

7. A method for forming via or contact holes with improved aspect ratios by using deep UV photoresist according to claim 1 further comprising the step of removing said Si-containing etch-stop layer.

8. A method for forming a large aspect ratio hole in an insulating material layer on a semi-conducting substrate comprising the steps of:

providing a pre-processed semi-conducting substrate having an etch-stop layer deposited on top;

depositing an insulating material layer on said etch-stop layer;

forming a deep UV photoresist layer on top of said insulating material layer;

irradiating said deep UV photoresist layer with UV radiation for at least 1 minute;

defining an opening for a hole;

etching said hole having an aspect ratio of larger than 8 in said insulating material layer by using said deep UV photoresist layer; and removing said etch-stop layer in said etched hole.

9. A method for forming a large aspect ratio hole in an insulating material layer on a semi-conducting substrate according to claim 8 further comprising the step of forming the hole with an aspect ratio between about 8 and about 20.

10. A method for forming a large aspect ratio hole in an insulating material layer on a semi-conducting substrate according to claim 8 further comprising the step of depositing said insulating material layer with an inter-level-dielectric (ILD) material.

11. A method for forming a large aspect ratio hole in an insulating material layer on a semi-conducting substrate according to claim 8 further comprising the step of depositing said insulating material layer in silicon oxide.

12. A method for forming a large aspect ratio hole in an insulating material layer on a semi-conducting substrate according to claim 8 further comprising the step of depositing said etch-stop layer by a material selected from the group consisting of $Si_3N_4$, SiON and SiC.

13. A method for forming a large aspect ratio hole in an insulating material layer on a semi-conducting substrate according to claim 8 further comprising the step of irradiating said deep UV photoresist layer with UV radiation for a time period between about 1 minute and about 10 minutes.

14. A method for forming a large aspect ratio hole in an insulating material layer on a semi-conducting substrate according to claim 8 further comprising the step of etching said hole for forming a via or a contact.

* * * * *